(12) United States Patent
Ogawara et al.

(10) Patent No.: US 6,419,007 B1
(45) Date of Patent: Jul. 16, 2002

(54) HEAT SINK-EQUIPPED COOLING APPARATUS

(75) Inventors: Toshiki Ogawara; Haruhisa Maruyama; Michinori Watanabe, all of Tokyo; Noriyasu Sasa, Hokkaido, all of (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 09/864,578

(22) Filed: May 24, 2001

(30) Foreign Application Priority Data

Mar. 30, 2001 (JP) ........................................ 2001-102306

(51) Int. Cl.[7] ................................................. F28F 7/00
(52) U.S. Cl. ...................... 165/80.3; 165/185; 257/722; 361/697
(58) Field of Search ................................ 165/80.3, 125, 165/185; 257/722; 361/704, 697

(56) References Cited

U.S. PATENT DOCUMENTS

| | | | | |
|---|---|---|---|---|
| 2,419,233 A | * | 4/1947 | Spender ...................... | 165/80.3 |
| 2,694,554 A | * | 11/1954 | Lemeshka ................... | 165/80.3 |
| 5,629,834 A | | 5/1997 | Kodama et al. | |
| 5,661,638 A | * | 8/1997 | Mira .......................... | 361/697 |
| 5,782,292 A | | 7/1998 | Ogawara et al. | |
| 5,785,116 A | | 7/1998 | Wagner | |
| 6,015,008 A | * | 1/2000 | Kogure et al. ............... | 165/185 |
| 6,152,214 A | * | 11/2000 | Wagner ....................... | 257/722 |
| 6,196,298 B1 | * | 3/2001 | Shaw ......................... | 165/80.3 |
| 6,196,300 B1 | * | 3/2001 | Checchetti ................... | 361/697 |

FOREIGN PATENT DOCUMENTS

JP    15982/1991    3/1991

\* cited by examiner

Primary Examiner—Henry Bennett
Assistant Examiner—Terrell McKinnon
(74) Attorney, Agent, or Firm—Rankin, Hill, Porter & Clark LLP

(57) ABSTRACT

A heat sink-equipped cooling apparatus capable of exhibiting increased cooling performance and durability and being reduced in dimensions in a radial direction thereof. A heat sink includes a radiation fin unit including a plurality of radiation fins arranged so as to surround a virtual central line while keeping a center thereof aligned with the central line. A cooling fan includes an impeller including a plurality of blades and rotated through a motor. The cooling fan is mounted on the heat sink in such a manner that the impeller is positioned above the radiation fin unit of the heat sink. The radiation fins each are inclined with respect to a virtual vertical plane so as to form a predetermined inclination angle θ therebetween. The inner edges of the radiation fins are connected in a manner to be heat-transferable or in a manner that a thermally conductive passage is formed between the inner edges.

13 Claims, 11 Drawing Sheets

HEAT SINK-EQUIPPED COOLING APPARATUS

BACKGROUND OF THE INVENTION

This invention relates to a cooling apparatus equipped with a heat sink for dissipating heat emitted from a heat source, and more particularly to a heat sink-equipped cooling apparatus suitable for use for cooling an electronic component such as a CPU or the like.

Heat generated or emitted from an electronic component such as a CPU or the like used in a computer is progressively increased with an increase in performance of the electronic component. Japanese Utility Model Publication No. 15982/1991 discloses a cooling apparatus which is so constructed that a cooling fan is arranged above a heat sink having a plurality of radiation fins radially arranged on a front surface of a base plate thereof, to thereby permit air discharged from the cooling fan to be fed to a central region of the base plate and then outwardly exhausted through the radiation fins. Another conventional cooling apparatus is disclosed in U.S. Pat. No. 5,629,834 (corresponding to Japanese Patent No. 2,765,801 and Japanese Patent Application Laid-Open Publication No. 111302/1985) and U.S. Pat. No. 5,782,292 (corresponding to Japanese Patent Application Laid-Open Publication No. 102566/1997), which includes a heat sink having a plurality of radiation fins arranged in directions of flowing of air radially discharged from an impeller of a fan. In the cooling apparatus disclosed, the radiation fins are arranged so as to surround a part of the impeller of the fan. A further conventional cooling apparatus is disclosed in U.S. Pat. No. 5,785,116 (corresponding to Japanese Patent Application Laid-Open Publication No. 219478/1998), which includes a heat sink having a plurality of radiation fins arranged on a base plate thereof so as to surround an impeller of a fan. The radiation fins are arranged in a manner to be inclined with respect to a central line extending through a center of the fan. In the cooling apparatus thus constructed, the heat sink including the plural radiation fins is formed by subjecting a cylindrical material to cutting which is carried out in a direction inclined with respect to a central line of the cylindrical material. Also, in the cooling apparatus, predetermined accurate relationship must be established between an angle of the radiation fins and an angle of the blades of the fan in order to permit the cooling apparatus to exhibit satisfactory cooling performance. Further, a motor of the fan is mounted on the heat sink.

The first and second conventional cooling apparatuses described above each are not suitable for use for cooling an electronic component increased in heat generation. The third conventional cooling apparatus described above is suitable for cooling an electronic component increased in heat generation as compared with the first and second cooling apparatuses. However, in the third cooling apparatus, the heat sink is increased in manufacturing cost and it is required to increase machining accuracy. Also, the third apparatus, as described above, is so constructed that the radiation fins are arranged so as to surround the impeller of the fan. Such arrangement causes a size of the cooling apparatus in a radial direction thereof to be significantly increased. Further, mounting of the motor of the fan on the heart sink in the third apparatus causes transmission of heat from the heat sink to the motor, leading to a deterioration in durability of the motor.

SUMMARY OF THE INVENTION

The present invention has been made in view of the foregoing disadvantage of the prior art.

Accordingly, it is an object of the present invention to provide a heat sink-equipped cooling apparatus which is capable of exhibiting increased cooling performance and durability and reducing a size thereof in a radial direction thereof.

It is another object of the present invention to provide a heat sink-equipped cooling apparatus which is capable of being reduced in manufacturing cost thereof.

It is a further object of the present invention to provide a heat sink-equipped cooling apparatus which is capable of exhibiting increased cooling performance.

It is still another object of the present invention to provide a heat sink-equipped cooling apparatus which is capable of permitting the number of radiation fins arranged to be increased to a degree sufficient to enhance cooling performance of the cooling apparatus.

In accordance with the present invention, a heat sink-equipped cooling apparatus is provided. The cooling apparatus includes a heat sink for dissipating heat generated from a heat source. The heat sink includes a base plate increased in thermal conductivity and including a front surface and a rear surface with which the heat source is contacted, a virtual central line defined so as to extend in a direction perpendicular to the front surface of the base plate, a plurality of virtual vertical planes defined so as to extend in both a radial direction from the central line and a vertical direction perpendicular to the front surface of the base plate and be spaced from each other at equal intervals in a circumferential direction of a virtual circle defined about the central line, and a radiation fin unit mounted on the front surface of the base plate in a manner to be heat-transferable and including a plurality of radiation fins arranged so as to surround the central line while aligning the central line with a center in arrangement of the radiation fins. The cooling apparatus also includes a cooling fan including an impeller which includes a plurality of blades and is rotated by a motor and mounted on the heat sink so that the impeller is positioned above the radiation fin unit.

In the heat sink, the radiation fins each include a lower edge positioned on a side of the base plate, an upper edge positioned opposite to the lower edge, an inner edge connecting the lower edge and the upper edge and positioned on the side of the center line, and an outer edge connecting the lower edge and the upper edge and positioned opposite to the inner edge, and a radiation surface positioned between the lower edge and the upper edge. The radiation fins each are fixedly mounted directly or indirectly on the front surface of the base plate so as to be positioned on an intersection line between the virtual vertical plane corresponding to each of the lower edges and the front surface of the base plate. Also, the radiation fins each are arranged while being inclined in an identical direction with respect to the virtual vertical plane (or toward one side in the circumferential direction of the virtual circle) so that an inclination angle θ of predetermined degrees between the radiation surface of the radiation fin and the virtual vertical plane may be defined. The radiation fin unit and cooling fan are arranged in positional relationship to each other which permits each of the blades of the cooling fan and the upper edge of each of the radiation fins to be opposite to each other. The cooling fan is arranged so as to permit cooling air to be fed to the radiation fins of the radiation fin unit. For this purpose, the cooling fan may be operated so as to blow air against the radiation fins. Alternatively, it may be operated so as to suck air from a side of the radiation fins.

When the impeller of the cooling fan and the heat sink are arranged in proximity to each other, air fed from the fan is substantially kept from being fed to a portion of the heat sink which is not opposite to the blades of the fan or a portion of the heat sink which is opposite to a cup member on which the blades of the impeller are fixed. Also, an air stream generated due to rotation of the impeller is not permitted to flow in an axial direction of the motor but is caused to flow in a direction of rotation of the impeller. Thus, arrangement of the radiation fins in a mere radial manner causes the radiation fins to act as flow resistance, to thereby fail to permit an increase in cooling performance of the cooling apparatus. This is also true of a structure which is constructed so as to forcibly flow air in a radial direction using an axial fan adapted to feed air in an axial direction, to thereby flow the air around radiation fins positioned outside an impeller, leading to cooling of the radiation fins. On the contrary, the structure of the present invention that air fed in the axial direction of the motor from the cooling fan is blown against the radiation fins from above the radiation fin unit enhances cooling performance of the cooling unit. Although this is not clearly supported by any specific theory, it would be considered that arrangement of the radiation fins employed in the present invention reduces flow resistance to air discharged from the cooling fan and produces a rapid air stream along the radiation surface of each of the radiation fins, to thereby increase the cooling performance. Thus, the cooling apparatus of the present invention exhibits cooling performance at substantially the same or higher level as an expensive cooling apparatus conventionally used without being increased in dimensions in a radial direction thereof and ensuring satisfactory durability of the motor.

Especially in the present invention, inner edges of two adjacent radiation fins of a plurality of radiation fins are connected with each other in a manner to be heat-transferable or in a manner that a thermal conductive passage is formed between the inner edges. When this configuration is adopted, a continuous, cylindrical and thermally conductive passage is formed in the center of a radiation fin unit. Normally it is difficult to cool the central portion of the radiation fin unit. With this formation, heat-radiation from each radiation fin is highly promoted also from the center of the radiation fin unit through this heat-transferable passage, thus resulting in more efficiently cooling the central part of the heat sink. Compared with the case in which inner edges of the radiation fins constituting a radiation fin unit are not connected with each other in a manner to be heat-transferable, it is possible to further enhance the radiation efficiency of a cooling apparatus as a whole when inner edges of the radiation fins are thermally connected with each other.

Furthermore, when the configuration according to the present invention is adopted, the generation of the noise is reduced compared with the conventional cooling apparatuses which have the same capacitance as the present fin unit, irrespective of the direction in which the impeller of the cooling fan is rotated.

Configuration for connecting inner edges of a plurality of the radiation fins in a manner to be heat-transferable can be in any suitable manner. For example, inner edges may be connected with each other by adhesive made of metal material or synthetic resin which are increased in thermal conductivity. Also each of inner edges of radiation fins may be connected to the outer surface of a metal cylinder (a cylinder of inverted frust-conical shape) positioned in the center of a radiation fin unit. From a view point of manufacturing, it is easier to use adhesives than a cylinder.

Ideally, plural virtual vertical planes are defined so as to be spaced from each other at equal intervals in the circumferential direction of a virtual circle. This ensures substantially uniform cooling of each of the radiation fins and base plate, to thereby further enhance cooling efficiency of the cooling apparatus.

The radiation fin unit may be formed by subjecting a single metal plate increased in thermal conductivity to bending. This reduces a manufacturing cost of the cooling apparatus and facilitates simplified manufacturing thereof.

A plurality of radiation fins need not be completely flat plates. The radiation fins can be curved along intersection lines between the virtual vertical planes and the front surface of the base plate. When curved radiation fins are used, the gap between inner edges of radiation fins become larger, and it becomes difficult to connect the inner edges of the radiation fins. In this case also, with the above-mentioned metal cylinder it is possible to easily connect the inner edges of the radiation fins with each other.

To further enhance cooling efficiency it is preferable to provide radiation fins with extended portions which are, around the central line, positioned outside of the blades of the fan so as to surround the blades aligning the center of the arrangement of the extended portions of the radiation fins with the center line. With this arrangement the area of radiation surface can be enlarged and radiation efficiency is increased. Also radiation efficiency may be heightened by providing uneven surface to the radiation fins thereby increasing the the area of radiation surface.

In the present invention, the radiation fin unit may be constructed so as to attain both simplified manufacturing of the cooling apparatus and mass production thereof. More specifically, a single fin mounting metal plate to be joined to the front surface of the base plate is provided. The radiation fins each are formed of a flat metal plate. Also, the radiation fins each are fixed at the lower edge thereof on the fin mounting metal plate. The radiation fins may be mounted on the fin mounting metal plate in any suitable manner.

The present invention may be constructed so as to further promote mass production of the cooling apparatus. For this purpose, the fin mounting metal plate is formed with a plurality of slits in a manner to radially extend from the central line and be spaced from each other at predetermined intervals in the circumferential direction. The radiation fins each are integrally formed at the lower edge thereof with a fit projection which is fitted in each of the slits. Also, the radiation fins each are joined to the fin mounting metal plate while keeping the fit projection fitted in each of the slits. This facilitates not only positioning of the radiation fins on the fin mounting metal plate, but joining of the radiation fins to the fin mounting metal plate while keeping the radiation fins inclined.

In manufacturing the radiation fin unit as described above, joint means for joining each radiation fin to the fin mounting metal plate can be also used for connecting inner edges of radiation fins, thereby facilitating a simplified manufacturing. In this case fit projections of the radiation fins may be projected from the rear side of the fin mounting metal plate. This will permit the radiation fins to be contacted directly with the base plate, when a radiation fin unit is joined to the front surface of the base plate, thereby heightening the radiation efficiency.

Alternatively, the base plate may be formed with a plurality of slits in a manner to radially extend from the central line and be spaced from each other at predetermined intervals in the circumferential direction. This reduces the number of parts required although it somewhat increases a manufacturing cost of the apparatus. Alternatively, the radiation fins each equipped with the fixing flange may be directly fixed on the front surface of the base plate.

The radiation fins may be formed into the same configuration. This leads to a reduction in manufacturing cost of the radiation fins and therefore the cooling apparatus. In order to cut out a number of radiation fins from a single large-sized metal plate by punching with increased yields, the radiation fins each preferably have a main portion formed into a substantially rectangular shape. Thus, the radiation fin unit is permitted to be provided at a central portion thereof with a space of a frust-conical configuration while having a center positioned on a central line of the radiation fin unit and being gradually reduced in diameter toward the base plate.

The inclination angle θ of the radiation fins is basically varied depending on the number of radiation fins. An increase in number of radiation fins leads to a reduction in inclination angle, whereas a decrease in the number leads to an increase in inclination angle. However, the inclination angle θ is preferably less than 45 degrees. The inclination angle of 45 degrees or more leads to a reduction in number of the radiation fins, to thereby cause a deterioration in cooling performance of the radiation fins. More preferably, the inclination angle θ is less than 45 degrees and more than 15 degrees, because it permits to increase the number of radiation fins to a degree sufficient to ensure satisfactory cooling performance of the radiation fin unit.

The cooling fan is preferably constituted by a so-called axial fan. The blades of the cooling fan are preferably inclined in a direction identical with a direction in which the radiation fins are inclined. In this instance, the cooling fan may-be operated to rotate the impeller in the direction in which the radiation fins are inclined. This enhances cooling performance of the cooling fan compared with the opposite case.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Figure 1:
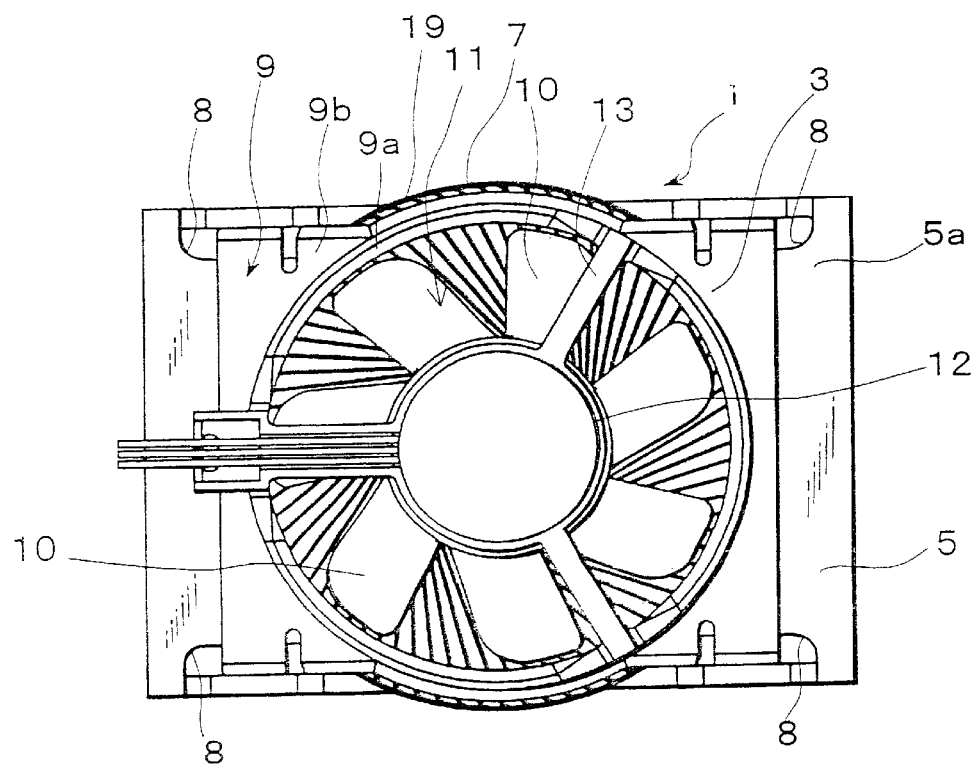
FIG. 1 is a plan view of a first embodiment of a heat sink-equipped cooling apparatus according to the present invention.
Figure 2:
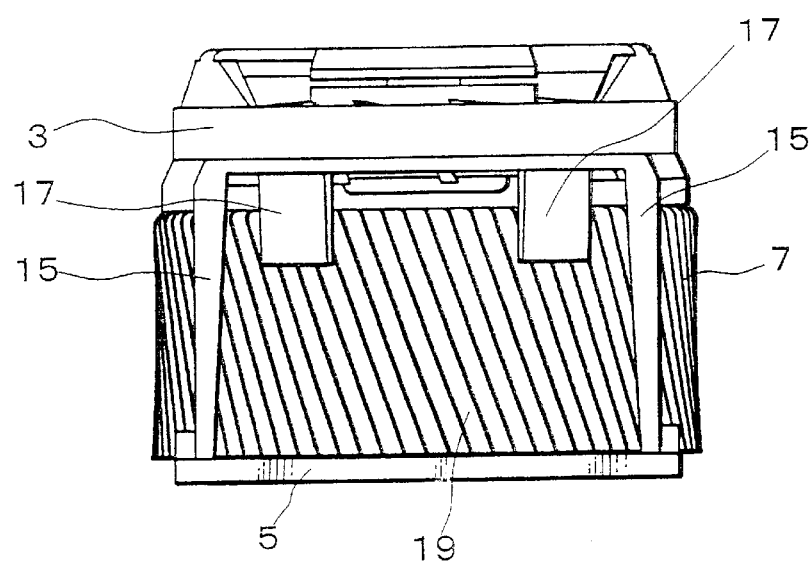
FIG. 2 is a right side elevation view of the first embodiment of a heat sink-equipped cooling apparatus.
Figure 3:
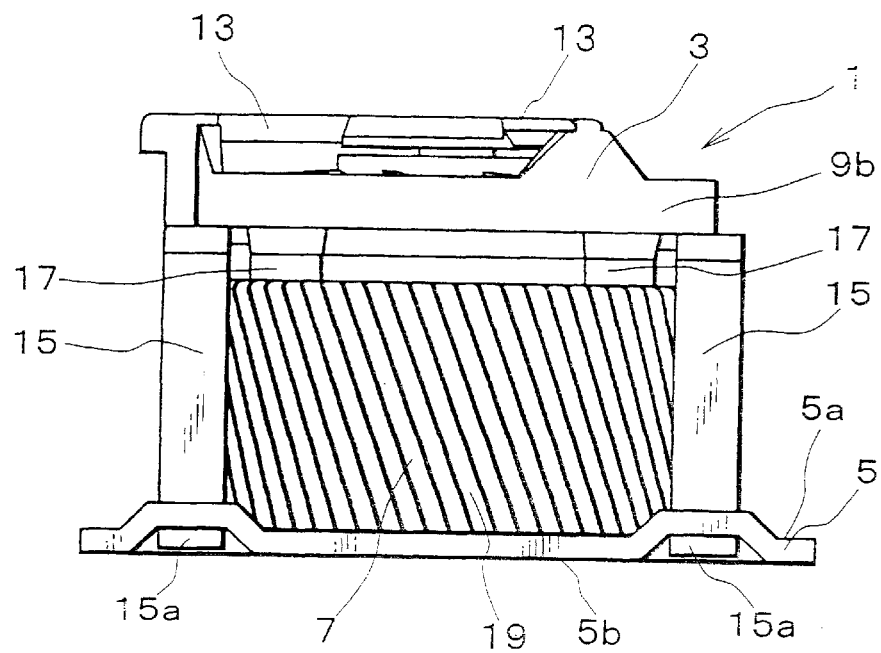
FIG. 3 is a front elevation view of the first embodiment of a heat sink-equipped cooling apparatus.
Figure 4:
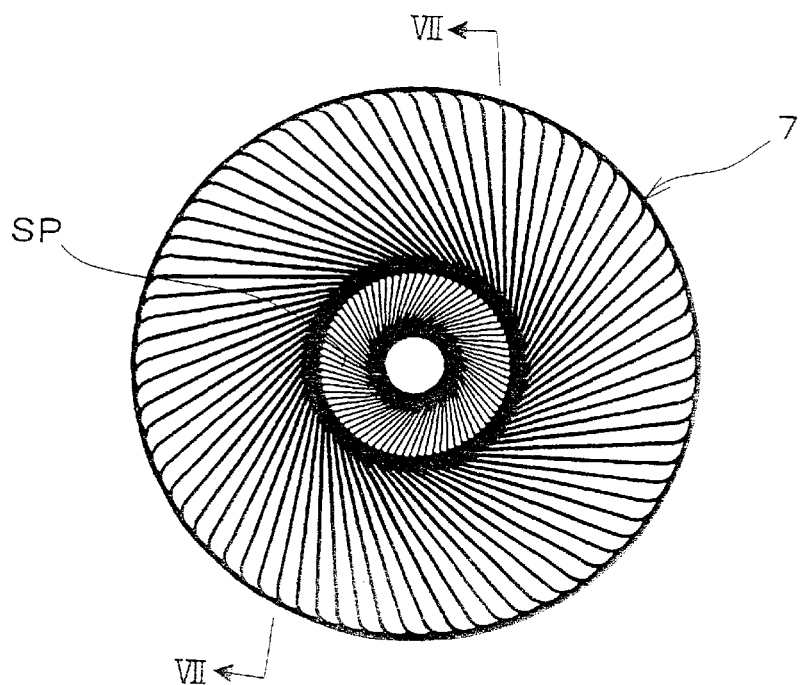
FIG. 4 is a plan view showing a radiation fin unit incorporated in the first embodiment of a heat sink-equipped cooling apparatus.
Figure 5:
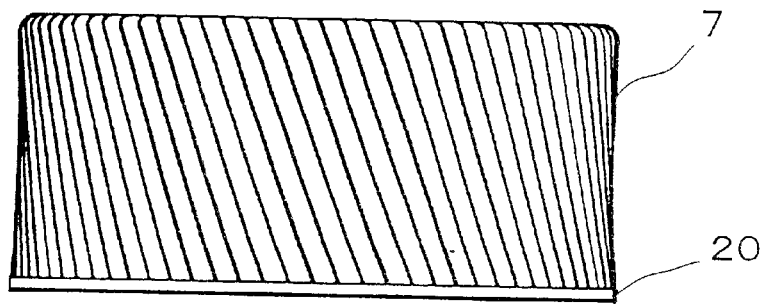
FIG. 5 is a front elevation view showing a radiation fin unit incorporated in the first embodiment of a heat sink-equipped cooling apparatus.
Figure 6:
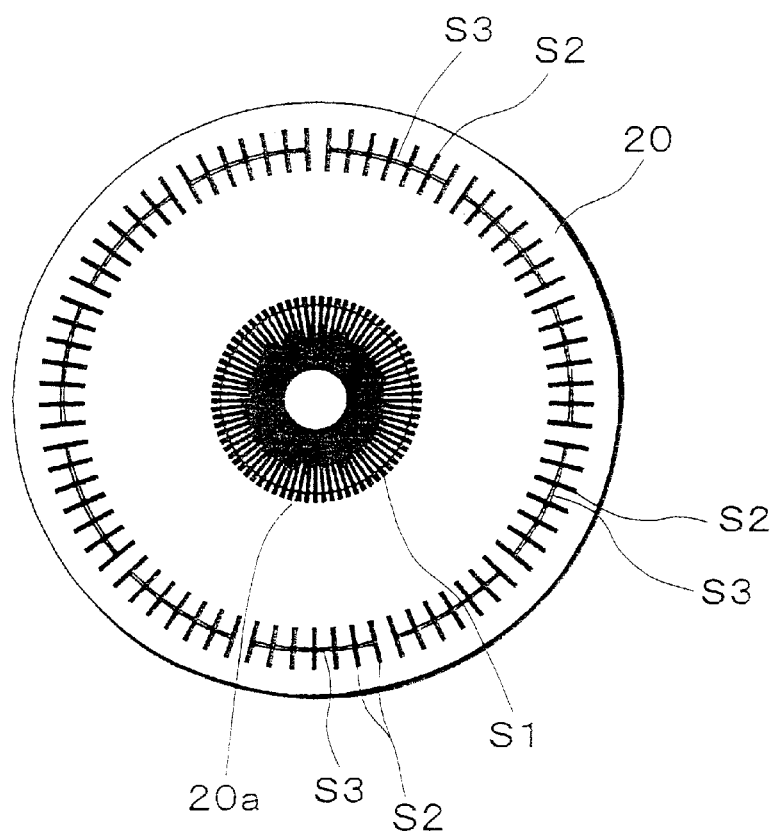
FIG. 6 is a bottom view showing a radiation fin unit incorporated in the first embodiment of a heat sink-equipped cooling apparatus.
Figure 7:
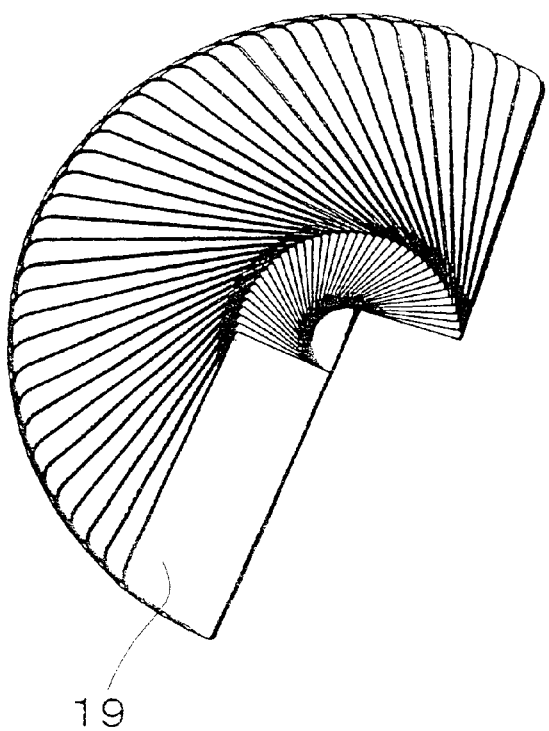
FIG. 7 is a plan view of the radiation fin unit taken along VII—VII line shown in FIG. 4.
Figure 8:
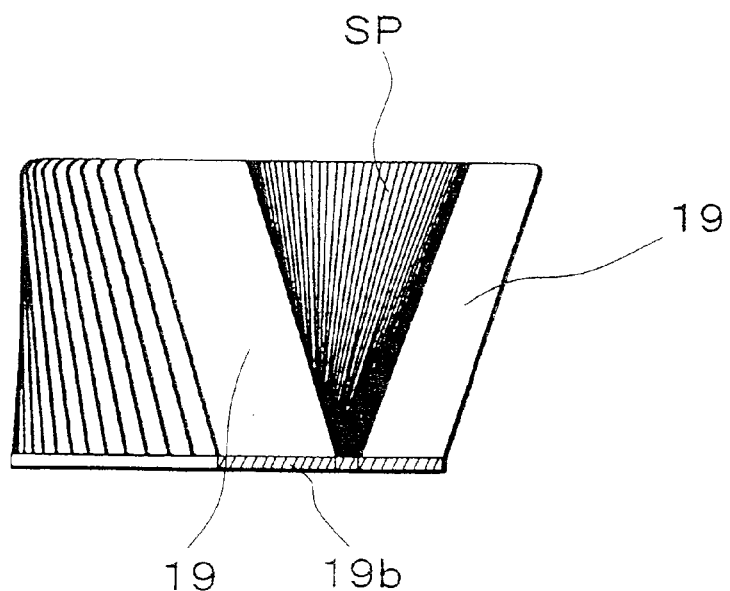
FIG. 8 is a front elevation view of the radiation fin unit in the condition shown in FIG. 7 (or a front elevation view of FIG. 7)
Figure 9:
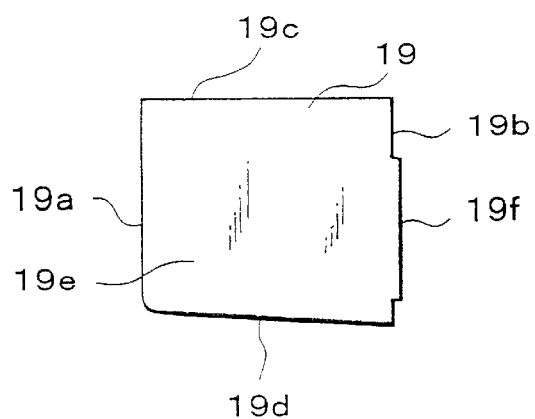
FIG. 9 is a plan view of one example of radiation fin showing manufacturing of the radiation fin unit.
Figure 10:
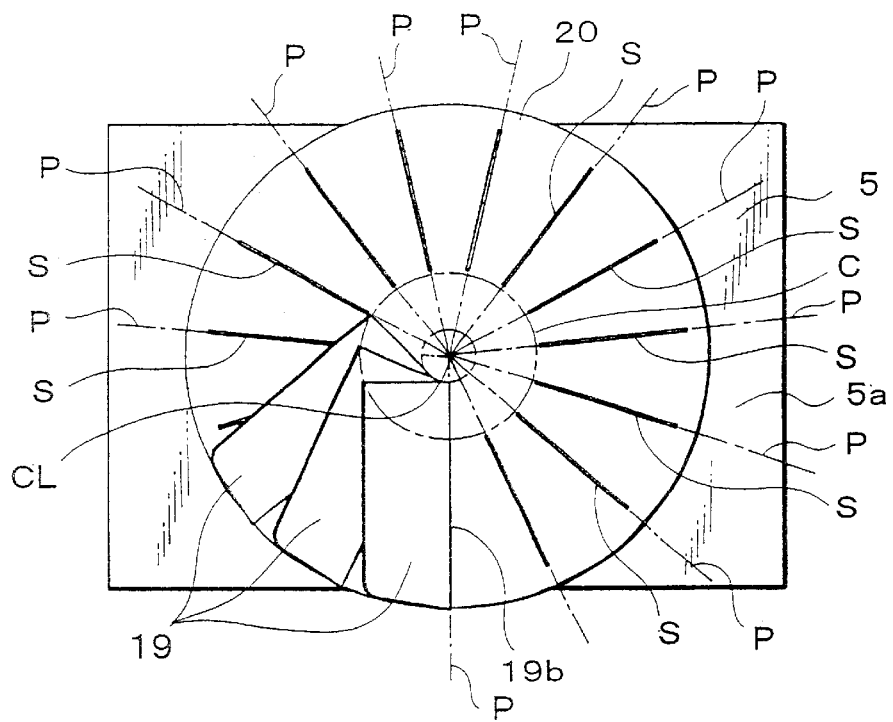
FIG. 10 is a schematic plan view showing a mid process of manufacturing of the radiation fin unit.
Figure 11:
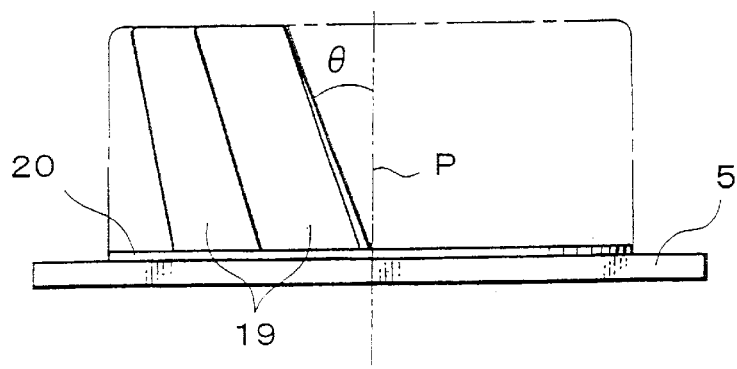
FIG. 11 is a schematic front elevation view of FIG. 10 showing a mid process of manufacturing of the radiation fin unit.

Now, a heat sink-equipped cooling apparatus according to the present invention will be described with reference to the accompanying drawings. FIGS. 1–3 are a plan view, a right side elevation view and a front view of a first embodiment of a heat sink-equipped cooling apparatus according to the present invention. FIGS. 4–6 are a schematic plan view, a front elevation view, and a bottom view of a radiation fin unit used in this embodiment. FIGS. 7–8 are partly sectioned plan view and front elevation view of the radiation fin unit shown in FIGS. 4–6. FIGS. 9–11 are schematic views showing the method of manufacturing a radiation fin unit shown in FIGS. 4–6.

A heat sink-equipped cooling apparatus of the illustrated embodiment, as shown in FIG. 1, generally includes a heat sink 1 and a cooling fan 3. The heat sink 1 includes a base plate 5 having a front surface 5a and a rear surface 5b with which a heat source is contacted, as well as a radiation fin unit 7. The base plate 5 may be made of a metal material such as, for example, aluminum alloy or copper alloy or a plate-like structure exhibiting an internal heat pipe function. Alternatively, it may be made of a non-metal material such as a carbon sheet or the like. The base plate 5 is formed at each of four corners thereof with a through-hole 8 (holding portion).

The cooling fan 3 is provided with a casing 9 made of synthetic resin. This casing 9 includes a casing body 9b provided with an air duct 9b in a manner to surround at least a part of a periphery of an impeller 11 provided with a plurality of blades 10, three webs 13 for supporting a housing 12 of a motor on the casing body 9b, and four pillars 15 each having one end held on the casing body 9b and the other end held in each of the through holes 8 of the base plate 5. The casing body 9b is provided with a plurality of contact sections 17 which are contacted with an outer surface of the radiation fin unit 7 to prevent lateral movement of the casing 9. The four pillars 15 each are provided at the other end thereof with a hook 15a acting as a held portion.

The radiation fin unit 7 includes a plurality of radiation fins 19 each formed of a flat metal plate made by punching. Then, the radiation fins 19 each are joined at a lower edge 19b thereof to a fin mounting metal plate 20 resulting in the radiation fin unit 7 being manufactured. FIGS. 9–11 are schematic views showing manufacturing of the radiation fin unit 7. In these Figures the number of radiation fins is small and the base plate 5 is shown as a mere flat plate to make the description simple. As shown in FIG. 9 the radiation fin 19 includes the lower edge 19b, the upper edge 19a positioned opposite to the lower edge 19b, the inner edge 19c, and the outer edge 19d and a radiation surface 19e which is surrounded by the lower edge 19b, the upper edge 19a, the inner edge 19c, and the outer edge 19d. The radiation fin 19 is integrally provided with a fit projection 19f at the lower edge 19b thereof.

The fin mounting metal plate 20 is formed into a disk-like shape and made so as to exhibit increased thermal conductivity. The fin mounting metal plate 20, as shown in FIG. 10, is formed with a plurality of slits S so as to radially extend from a central line CL and be spaced from each other at predetermined intervals in a circumferential direction of a virtual circle C.

In order to specify a configuration of the radiation fins 19 and a posture of the radiation fins 19 with respect to the base plate 5, a plurality of virtual vertical planes P are supposed which are defined so as to extend in both a radial direction from the central line CL and a vertical direction perpendicular to the front surface 5a of the base plate 5 and be spaced from each other at equal intervals in a circumferential direction of a virtual circle C defined about the central line CL. The plural radiation fins 19 are arranged so as to surround the central line CL while aligning it with the center of arrangement of the radiation fins 19. As shown in FIG. 11, each slit S is included in each virtual vertical plane which are defined so as to extend in both a radial direction from the central line CL and a vertical direction perpendicular to the front surface 5a of the base plate 5 and be spaced from each other at equal intervals in a circumferential direction of a virtual circle C defined about the central line CL. The slits S each are formed into a width larger than a thickness of the radiation fin 19 and formed into dimensions which permit each of the radiation fin 19 to be inclined at a predetermined angle $\theta$ in a circumferential direction of the virtual circle C keeping each of the fit projections 19f fitted in each of the slits S.

After the fit projection 19f of each of the radiation fins 19 is fitted in the slit S, the radiation fin 19 is inclined toward one side in the circumferential direction of the virtual circle C (or in a clockwise direction in FIG. 10) so that the lower edge 19b may be joined to the fin mounting metal plate 20 in a manner to be heat-transferable or in a manner to permit heat transfer to be carried out therebetween. Alternatively, the joining may be carried out by means of a thermal conductive adhesion or soldering or the like. The radiation fins 19 may be joined to the fin mounting metal plate 20 in turn. Alternatively, the joining may be carried out by, first, fitting the fit projections 19f of the radiation fins 19 in the slits S and then concurrently inclining the radiation fins 19 as described above while previously applying a thermosetting adhesive to a surface of the fin mounting metal plate 20, followed by curing of the adhesive. This results in the radiation fin unit 7 being readily manufactured at a reduced cost. Alternatively, a rear side of a fin mounting metal plate may be immersed in a pool of adhesive. Then by capillary phenomenon, adhesive is sucked up and join a plurality of radiation fins to a fin mounting metal plate 20. In place of thermal conductive adhesion joining may be made by soldering, brazing, welding, or ultrasonic welding. The slits S highly facilitate positioning of the radiation fins 19 and joining of the radiation fins 19 to the fin mounting metal plate 20.

In this embodiment a radiation fin unit includes 77 radiation fins positioned in a circumferential direction of a virtual circle C with an angle of 4.675° from each other around the central line. As shown in this radiation fin unit, as the number of radiation fins becomes larger, each inner edge 19c of the radiation fins is contacted with adjacent inner edges when the radiation fins are inclined in identical direction. As is seen from the FIGS. 4, 7 and 8, the radiation fin unit manufactured in a manner described above is provided at the central portion thereof with a space of a frust-conical configuration while having a center positioned on a central line CL of the radiation fin unit and being gradually reduced in diameter toward the base plate.

The radiation fin unit 7 shown in the FIGS. 4–8 is manufactured basically according to the above description, however, the shape of slits or shape of the radiation fins, to be concrete, are different from the above description. At the center of a fin mounting metal plate 20, a through hole 20a of a circular configuration is formed. At the periphery of the through hole 20a, 77 inner split slits S1 are formed in a radial direction and near the outer periphery of the fin mounting metal plate 20, 77 outer split slits S2 are formed. The 77 split slits S2 are communicated with arc-shaped communicating slits S3. A fit projection 19f which is formed at the lower edge 19b of the radiation fin 19 is formed in such a shape to be fitted in both split slits S1 and S2. In this configuration, when 77 radiation fins 19 are joined to the fin mounting metal plate 20, the rear side of the fin mounting metal plate may be immersed in a pool of adhesive. Then through the through hole 20a and slits S1–S3 the adhesive rises above the front surface of the base plate by capillary phenomenon. As a result it is possible to connect the inner edges of the radiation fins 19 in a manner to be heat-transferable, when the radiation fins are joined to the fin mounting metal plate. Alternatively adhesive may be applied on the inner surface of a frust-conical space formed in the center of the radiation fin unit after radiation fins 19 are joined to the fin mounting metal plate 20. In the illustrated embodiment, adhesive flows over the front surface of the fin mounting metal plate 20 through the arc-shaped slits S3, and the adhesive gets inside a clearance formed between the surface of the fin mounting metal plate 20 and the radiation fins 19 thereby joint strength is increased.

The thus-manufactured radiation fin unit 7 is joined to a front surface of a base plate 5 using a joint means such as adhesive increased in thermal conductivity. This results in providing a heat sink structure which is constructed so that the radiation fins 19 each may be fixed indirectly on the front surface 5a of the base plate 5 while being positioned along an intersection line between the virtual vertical plane P corresponding to the lower edge 19b of the radiation fin 19 and the front surface 5a of the base plate 5, and that the radiation fins 19 each may be inclined in an identical direction with respect to the virtual vertical plane P (or toward one side in the circumferential direction of the virtual circle C) so as to form a predetermined inclination angle θ between the radiation surface 19e of the radiation fin 19 and the virtual vertical plane P. In this embodiment, the base plate 5 and radiation fin unit 7 each may be formed of copper alloy.

In the illustrated embodiment the blades 10 of the impeller 11 are inclined in a direction identical with a direction in which a plurality of the radiation fins are inclined. The cooling fan 3 may be operated to rotate the impeller in the direction in which the radiation fins are inclined. This way cooling performance of the cooling apparatus is better than the case in which the cooling fan 3 is operated to rotate the impeller in the opposite direction.

The radiation fins 19 each are preferably arranged to be inclined so that an angle (inclination angle) θ between the radiation surface 19e of the radiation fin 19 and the virtual vertical plane P is less than 45 degrees. More specifically, the plural radiation fins 19 each are inclined in the same direction with respect to the virtual vertical plane P corresponding thereto or toward one side in the circumferential direction of the virtual circle C. The inclination angle θ is preferably set to be less than 45 degrees and more than 15 degree. The angle set within such a range permits the number of radiation fins 19 arranged to be increased to a degree sufficient to permit the cooling apparatus of the illustrated embodiment to exhibit satisfactory cooling performance. Such an angular range reduces a pressure loss of air flow, to thereby increase a velocity of air flow occurring between the radiation fins 19. This permits the amount of air discharged from the cooling apparatus to be increased, so that it may be increased in cooling efficiency. An optimum value of the angle θ may be determined depending on a direction of rotation of an impeller of the cooling fan 3 and a rotational speed thereof, an angle of blades 10 of the impeller, and an area of the radiation fins opposite to the blades 10. Also, a direction in which the radiation fins 19 are inclined may be opposite to that shown in FIGS. 1–8.

Each of the blades 10 and the upper edge 19a of each of the radiation fins are so positioned that a gap therebetween is set to be within a range of, for example, between about 5 mm and about 10 mm. In the, illustrated embodiment, the blades 10 of the cooling fan 3 are arranged at an angle which permits air to be blown against the radiation fins 19 of the radiation fin unit 7.

Then, air which has been thus blown against the radiation fin unit 7 from the cooling fan 3 is permitted to enter a gap between each adjacent two radiation fins 19 through an opening defined between the upper edges 19a of each adjacent two radiation fins 19 and then be radially outwardly discharged from the radiation fin unit 7 through the gap.

Figure 12:
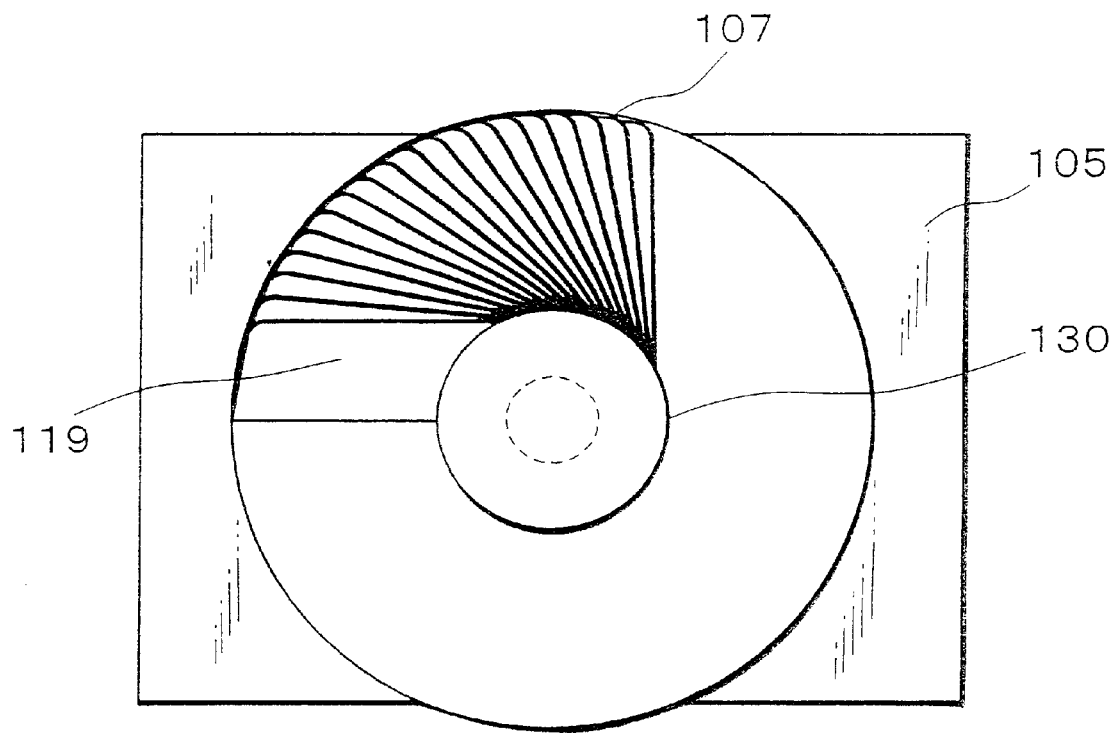
FIG. 12 is a schematic plan view showing a mid process of manufacturing of another modification of the radiation fin unit.
Figure 13:
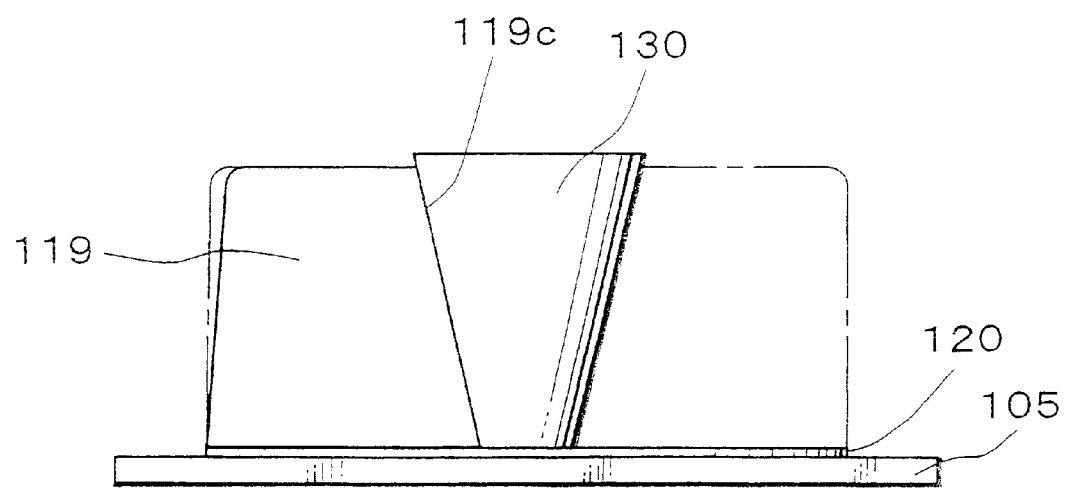
FIG. 13 is a schematic front elevation view of FIG. 12 showing a mid process of manufacturing of the radiation fin unit.

FIGS. 12 and 13 show the configuration of a modification of a radiation fin unit 107. In this radiation fin unit 107, a metal cylinder 130 (inverted frust-conical cylinder) is disposed in the center of the radiation fin unit 107 and each of the inner edges 119c of the plural radiation fins 119 is joined to the outer surface of the cylinder in a manner to be heat-transferable or in a manner to permit heat transfer to be carried out therebetween. For the joining, thermosetting adhesive, soldering or the like may be used. In this case the lower end of the cylinder 130 is joined also to the fin mounting metal plate 120.

Figure 14:
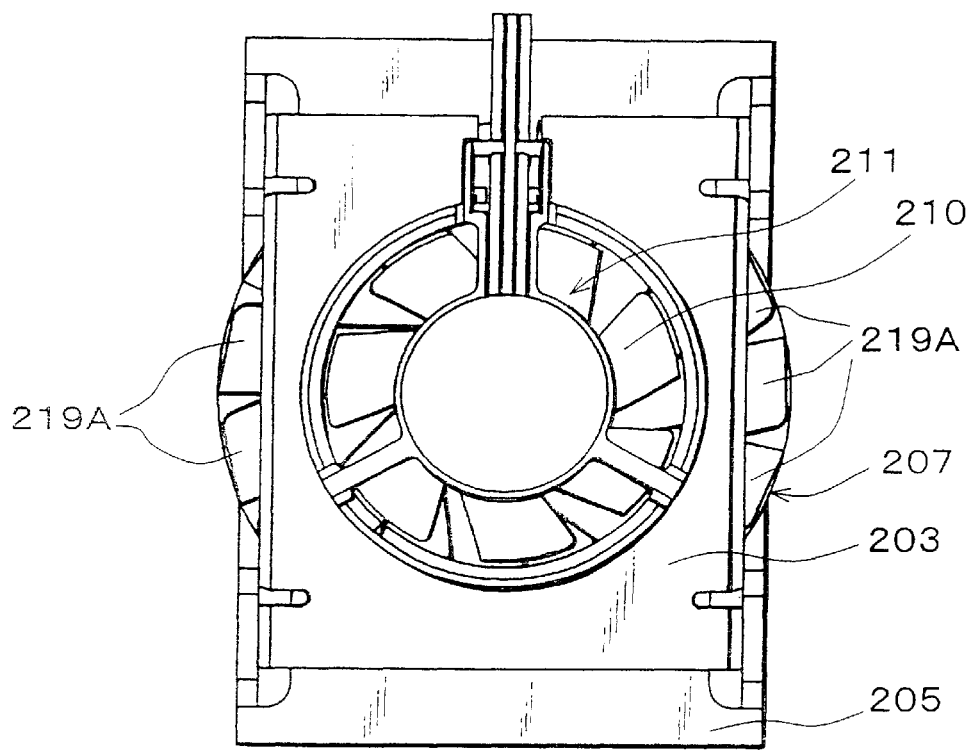
FIG. 14 is a plan view showing a second embodiment of a heat sink-equipped cooling apparatus according to the present invention.
Figure 15:
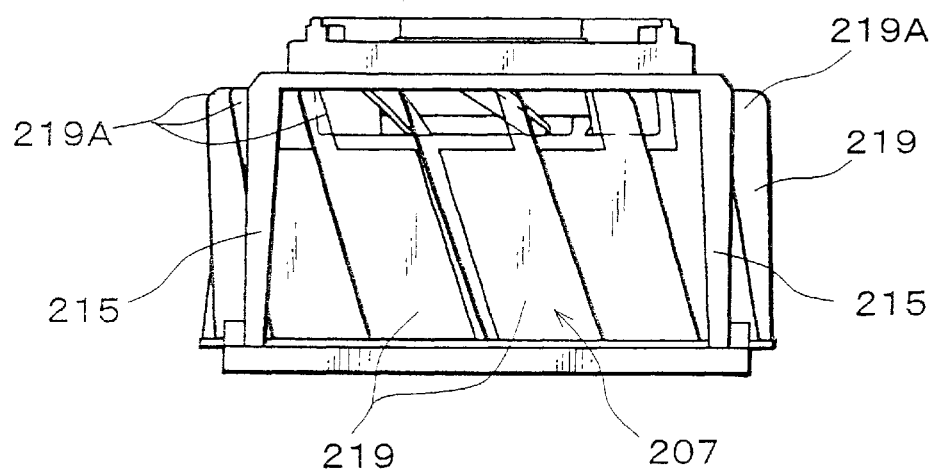
FIG. 15 is a front elevation view of the heat sink-equipped cooling apparatus shown in FIG. 2.
Figure 16:
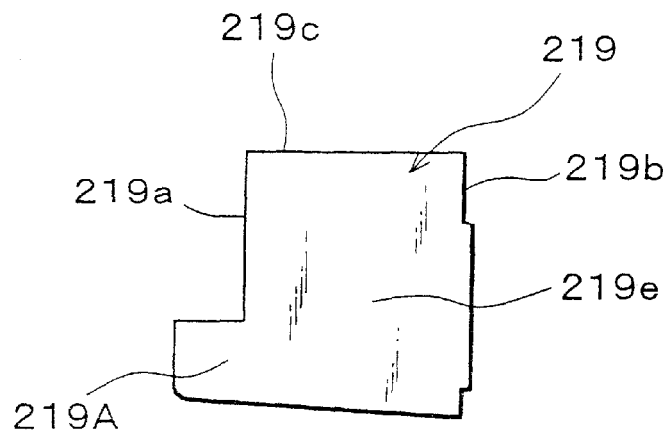
FIG. 16 is a schematic plan view showing one of radiation fins incorporated in the heat sink-equipped cooling apparatus shown in FIGS. 14–15.
Figure 17:
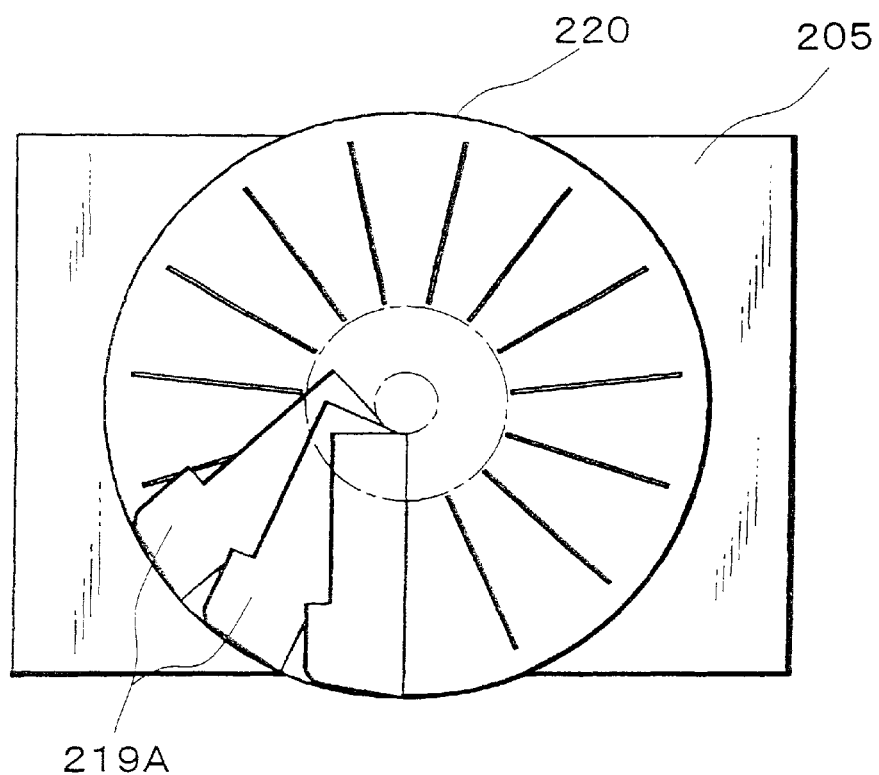
FIG. 17 is a schematic plan view showing a mid process of manufacturing of a radiation fin unit incorporated in the heat sink-equipped cooling apparatus shown in FIGS. 14–15.
Figure 18:
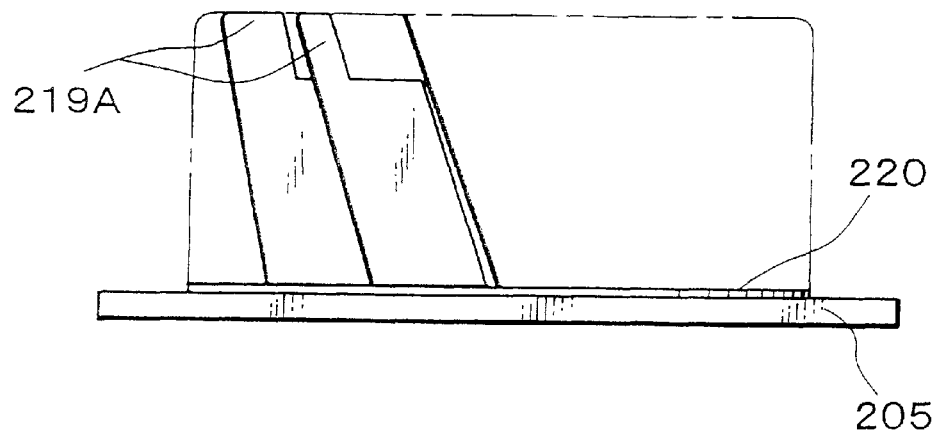
FIG. 18 is a schematic side elevation view of FIG. 17 showing a mid process of manufacturing of a radiation fin unit incorporated in the heat sink-equipped cooling apparatus shown in FIGS. 14–15.

FIGS. 14–15 are a plan view and a front elevation view of another modification of the cooling apparatus according to the present invention. For the substantially same elements as shown in the FIGS. 1–11, the reference numerals correspond to those discussed in the first embodiment described above, except with an additional prefix of 200, and the description will not be repeated here. The FIGS. 16–18 show the configuration of a radiation fin unit of the illustrated embodiment. For simplifying the description the number of the radiation fins 219 is small in the FIGS. 14–18. The illustrated embodiment is different from the embodiments described above on the point that a plurality of radiation fins 219 are provided with extended portions 219A which are, around the center line, positioned at the outside of a plurality of blades to surround the blades 210 aligning the center of the arrangement of the extended portions of the radiation fins with the central line CL. On the other points the illustrated embodiment is the same as the embodiments described above. In this arrangement radiation surface area of the radiation fins 219 can be increased and the cooling performance can be heightened. When the number of the radiation fins is small as is illustrated, each of the inner edges 219c of the radiation fins may be joined to the metal cylinder 130 in a manner to be heat-transferable.

Figure 19:
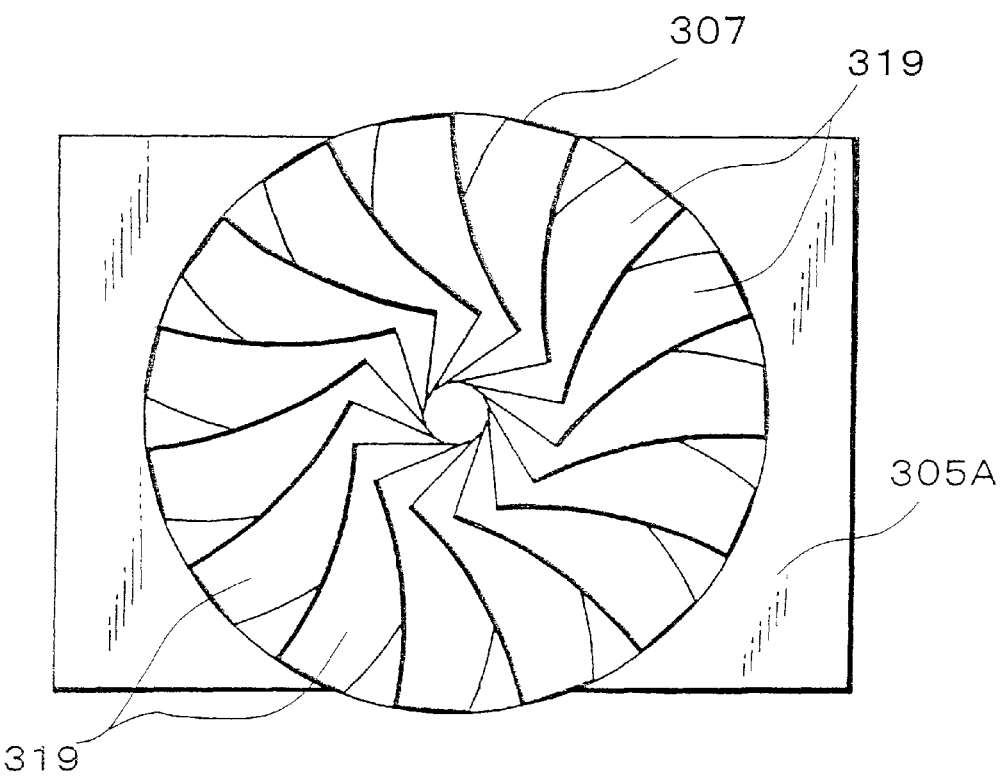
FIG. 19 is a schematic plan view showing the configuration of another modification of the radiation fin unit.

FIG. 19 shows the configuration of a modification of the radiation fin unit 307 in still another embodiment of a cooling apparatus according to the present invention. The radiation fins of the radiation fin unit 307, as is shown in FIG. 14, are curved along the intersection line between the virtual vertical plane P and front surface 305a of the base plate. When this kind of curved radiation fins are used, the gap formed between each two adjacent radiation fins becomes larger and it becomes more difficult to join inner edges. In this case also a metal cylinder, as shown in the FIGS. 12–13, can be used to easily join inner edges of the radiation fins in a manner to be heat-transferable.

Ideally, the plural virtual vertical planes are defined so as to be spaced from each other at equal intervals in the circumferential direction of the virtual circle. This ensures substantially uniform cooling of each of the radiation fins and base plate, to thereby further enhance cooling efficiency of the cooling apparatus.

Figure 20A:
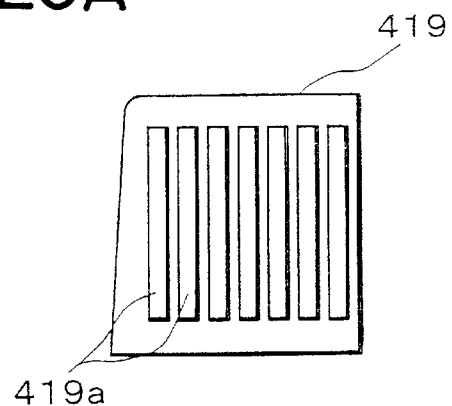
FIGS. 20 (A) and (B) are a front elevation view and a plan view of a modification of radiation fin for the radiation fin unit incorporated in the heat sink-equipped cooling apparatus according to the present invention.
Figure 20B:
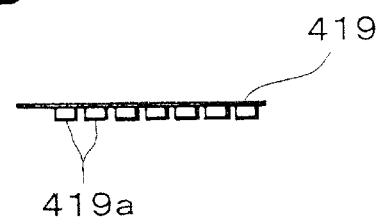

Alternatively the thickness of the radiation fins 419 may be thickened cyclically as shown in the FIGS. 20 (A) and (B), thereby making the surface of the radiation fins uneven. In this way the radiation surface area of the radiation fins 419 can be increased and the cooling efficiency of the cooling apparatus can be further enhanced.

Figure 21A:
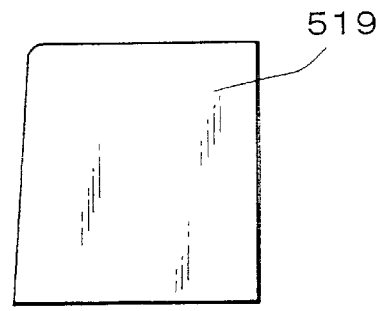
FIGS. 21 (A) and (B) are a front elevation view and a plan view of another modification of radiation fin for the radiation fin unit incorporated in the heat sink-equipped cooling apparatus according to the present invention.
Figure 21B:

Alternatively the radiation fins may be manufactured in a waveshape as is shown in the FIGS. 21 (A) and (B). In this way also the radiation surface area of the radiation fins 519 can be increased and the cooling efficiency of the cooling apparatus can be enhanced.

Figure 22A:
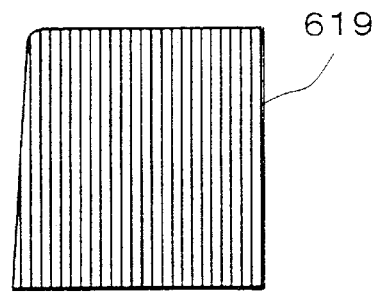
FIGS. 22 (A) and (B) are a front elevation view and a plan view of still another modification of radiation fin for the radiation fin unit incorporated in the heat sink-equipped cooling apparatus according to the present invention.
Figure 22B:
Figure 23A:
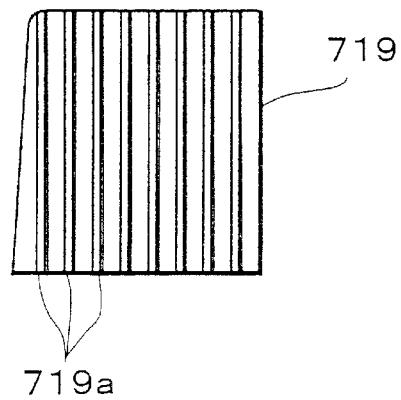
FIGS. 23 (A) and (B) are a front elevation view and a plan view of a further modification of radiation fin for the radiation fin unit incorporated in the heat sink-equipped cooling apparatus according to the present invention.
Figure 23B:
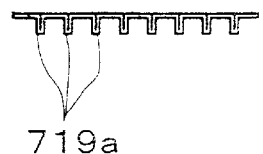

Alternatively the radiation fins may be corrugated so as to form a zigzag shape as is shown in the FIGS. 22 (A) and (B), thereby making the surface of the radiation fins uneven. In this way also the radiation area of the radiation fins 619 can be increased and the cooling efficiency of the cooling apparatus can be enhanced. Alternatively part of the radiation fins may be bent as shown in the FIGS. 23 (A) and (B) to form protrusions. In this way the radiation surface area of the radiation fins 719 can be increased and the cooling efficiency of the cooling apparatus can be enhanced.

As can be seen from the foregoing, the cooling apparatus of the present invention exhibits cooling performance at substantially the same level or higher as an expensive cooling apparatus conventionally used without being increased in dimensions in a radial direction thereof and ensuring satisfactory durability of the motor.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A cooling apparatus comprising:

a heat sink for dissipating heat generated from a heat source;

said heat sink including a base plate increased in thermal conductivity and including a front surface and a rear surface with which the heat source is contacted, a virtual central line defined so as to extend in a direction perpendicular to said front surface of said base plate, a plurality of virtual vertical planes defined so as to extend in both a radial direction from said central line and a vertical direction perpendicular to said front surface of said base plate and be spaced from each other at equal intervals in a circumferential direction of a virtual circle defined about said central line, and a radiation fin unit mounted on said front surface of said base plate in a manner to be heat-transferable and including a plurality of radiation fins arranged so as to surround said central line while aligning said central line with a center in arrangement of said radiation fins; and a cooling fan including an impeller which includes a plurality of blades and is rotated by a motor and mounted on said heat sink so that said impeller is positioned above said radiation fin unit;

said radiation fins each including a lower edge positioned on a side of said base plate, an upper edge positioned opposite to the lower edge, an inner edge connecting the lower edge and the upper edge and positioned on the side of the center line, and an outer edge connecting the lower edge and the upper edge and positioned opposite to the inner edge, and a radiation surface positioned between said lower edge and said upper edge;

said radiation fins each being fixedly mounted on said front surface of said base plate so as to be positioned on an intersection line between said virtual vertical plane corresponding to each of said lower edges and said front surface of said base plate;

said radiation fins each being arranged while being inclined in an identical direction with respect to said virtual vertical plane so that an inclination angle θ of predetermined degrees between said radiation surface of said radiation fin and said virtual vertical plane may be defined;

said inner edges of each two adjacent radiation fins are joined with each other in a manner to be heat-transferable;

said radiation fin unit and cooling fan being arranged in positional relationship which permits each of said blades of said cooling fan and said upper edge of each of said radiation fins to be opposite to each other;

said cooling fan being arranged so as to permit cooling air to be fed to said radiation fins of said radiation fin unit.

2. A cooling apparatus as defined in claim 1, wherein said inner edges of said each two radiation fins are joined with each other with adhesive of metal or synthetic resin.

3. A cooling apparatus as defined in claim 2, wherein a space surrounded by said inner edges of said plurality of radiation fins each of which is joined with each other has a shape of frust conical configuration having a center positioned on said central line of the radiation fin unit and being gradually reduced in diameter toward said base plate.

4. A cooling apparatus as defined in claim 1, wherein a metal cylinder is disposed in the center of said radiation fin unit, and said inner edges of said plurality of radiation fins are joined to the outer surface of said cylinder in a manner to be heat-transferable.

5. A cooling apparatus as defined in claim 4, wherein said plurality of radiation fins are curved along intersection line between said virtual vertical plane and said front surface of the base plate.

6. A cooling apparatus as defined in claim 1, wherein said radiation fins are provided, on one-on-one basis, with extended portions which are, around the central line, positioned outside of said plurality of blades to surround the blades aligning the center of the arrangement of the extended portions of the radiation fins with the central line.

7. A cooling apparatus as defined in claim 1, wherein said radiation fin unit includes a single fan mounting metal plate joined to said front surface of said base plate;

said radiation fins each are formed of a flat metal plate; and said radiation fins each are fixed at said lower edge thereof on said fin mounting metal plate.

8. A cooling apparatus as defined in claim 7, wherein said fin mounting metal plate is formed with a plurality of slits in a manner to radially extend from said central line and be spaced from each other at predetermined intervals in said circumferential direction;

said radiation fins each are integrally formed at said lower edge thereof with a fit projection which is fitted in each of said slits; and said radiation fins each are joined to said fin mounting metal plate while keeping said fit projection fitted in each of said slits.

9. A cooling apparatus as defined in claim 8, wherein said fit projections of said plurality of radiation fins are fitted in said plurality of slits, and said fit projections are projected from the side of the rear surface of said fin mounting metal plate thereby contacting said front surface of said base plate directly.

10. A cooling apparatus as defined in claim 1, wherein said radiation surfaces of said plurality of radiation fins are formed into uneven surfaces.

11. A cooling apparatus as defined in claim 1 wherein, said radiation fins are joined to said base plate directly.

12. A cooling apparatus as defined in claim 11, wherein said base plate is formed with a plurality of slits in a manner to radially extend from said central line and be spaced from each other at predetermined intervals in said circumferential direction;

said radiation fins each are integrally formed at said lower edge thereof with a fit projection which is fitted in each of said slits, and said radiation fins each are joined to said fin mounting metal plate while keeping said fit projection fitted in each of said slits.

13. A cooling apparatus as defined in claim 1, wherein said casing of cooling fan includes a casing body provided with an air duct which surrounds at least a part of a periphery of an impeller, a plurality of webs for supporting said housing of a motor on said casing body, and a plurality of pillars each having one end held on said casing body and the other end held on said base plate; and said base plate being formed with a plurality of holding portions in each of which said other end of each of said pillars is held.

* * * * *